United States Patent
Li

(10) Patent No.: US 9,891,529 B2
(45) Date of Patent: Feb. 13, 2018

(54) LIGHT TRANSMISSION DEVICE AND METHOD FOR SEMICONDUCTOR MANUFACTURING PROCESS

(71) Applicant: Taiwan Semiconductor Manufacturing Co., Ltd, Hsin-Chu (TW)

(72) Inventor: Yan-Ping Li, Tainan (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 189 days.

(21) Appl. No.: 14/229,026

(22) Filed: Mar. 28, 2014

(65) Prior Publication Data

US 2015/0277231 A1 Oct. 1, 2015

(51) Int. Cl.
*G03B 27/54* (2006.01)
*G03F 7/20* (2006.01)

(52) U.S. Cl.
CPC ...... *G03F 7/70058* (2013.01); *G03F 7/70991* (2013.01)

(58) Field of Classification Search
CPC .............................. G03F 7/70058; G03F 7/708
See application file for complete search history.

(56) References Cited

U.S. PATENT DOCUMENTS

| | | | | |
|---|---|---|---|---|
| 5,028,955 A * | 7/1991 | Hayashida | .......... | G03F 7/70725 355/53 |
| 5,361,121 A * | 11/1994 | Hattori | .......... | G03F 7/2022 355/50 |
| 5,929,976 A * | 7/1999 | Shibuya | .......... | G03F 7/2028 355/53 |
| 5,982,474 A * | 11/1999 | Akiyama | .......... | G03F 7/2026 355/50 |
| 6,618,118 B2 * | 9/2003 | Minnaert | .......... | G03F 7/2028 355/30 |
| 9,081,149 B2 * | 7/2015 | Wu | .......... | G02B 7/32 |
| 2004/0169869 A1 * | 9/2004 | Shin | .......... | G01N 21/9501 356/635 |
| 2004/0241886 A1 * | 12/2004 | Hong | .......... | G03F 7/2026 438/7 |
| 2006/0001852 A1 * | 1/2006 | Lee | .......... | G03F 7/70275 355/53 |
| 2006/0139591 A1 * | 6/2006 | Jung | .......... | G03F 7/70358 355/53 |
| 2006/0250594 A1 * | 11/2006 | Iwashita | .......... | G03F 7/2022 355/53 |
| 2007/0273858 A1 * | 11/2007 | Nagasaka | .......... | G03F 7/70208 355/67 |

(Continued)

*Primary Examiner* — Deoram Persaud
(74) *Attorney, Agent, or Firm* — McClure, Qualey & Rodack, LLP

(57) ABSTRACT

A light transmission device is provided. The light transmission device includes a light source, a light transmission module and at least one light regulator. The light transmission module transmits a portion of the light of the light source for implementing a first semiconductor manufacturing process over the wafer. The light source is utilized to implement a second semiconductor manufacturing process over a wafer. The first semiconductor manufacturing process is different from the second semiconductor manufacturing process. The at least one light regulator regulates the light of the light transmission module transmitted to the wafer.

20 Claims, 6 Drawing Sheets

(56) References Cited

U.S. PATENT DOCUMENTS

| | | | |
|---|---|---|---|
| 2008/0174847 A1* | 7/2008 | Bentley | G03F 7/70291 359/237 |
| 2008/0197299 A1* | 8/2008 | Hoshino | H01S 3/2383 250/504 R |
| 2008/0204685 A1* | 8/2008 | Kono | G03F 7/70291 355/53 |
| 2009/0047604 A1* | 2/2009 | Stoeldraijer | G03F 7/70425 430/311 |
| 2010/0091256 A1* | 4/2010 | Mangold | G03F 7/70291 355/53 |

* cited by examiner

LIGHT TRANSMISSION DEVICE AND METHOD FOR SEMICONDUCTOR MANUFACTURING PROCESS

BACKGROUND

There are different kinds of semiconductor manufacturing processes to be implemented on a wafer. Generally, different kinds of light sources are selected in accordance with the implemented semiconductor manufacturing process. For example, a WEE (Wafer Edge Exposer) module is utilized to expose the edge of the wafer. Generally, a WEE module includes a WEE lamp, a WEE housing and some optical parts. However, the WEE lamp, the WEE housing and/or the optical parts may have decaying intensities and short lifetimes. In addition, the maintenance and cleaning of the WEE lamp, the WEE housing and/or some optical parts require increased cost and labor. Therefore, there are still challenges in exposing the edge of the wafer in a more reliable and efficient way.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
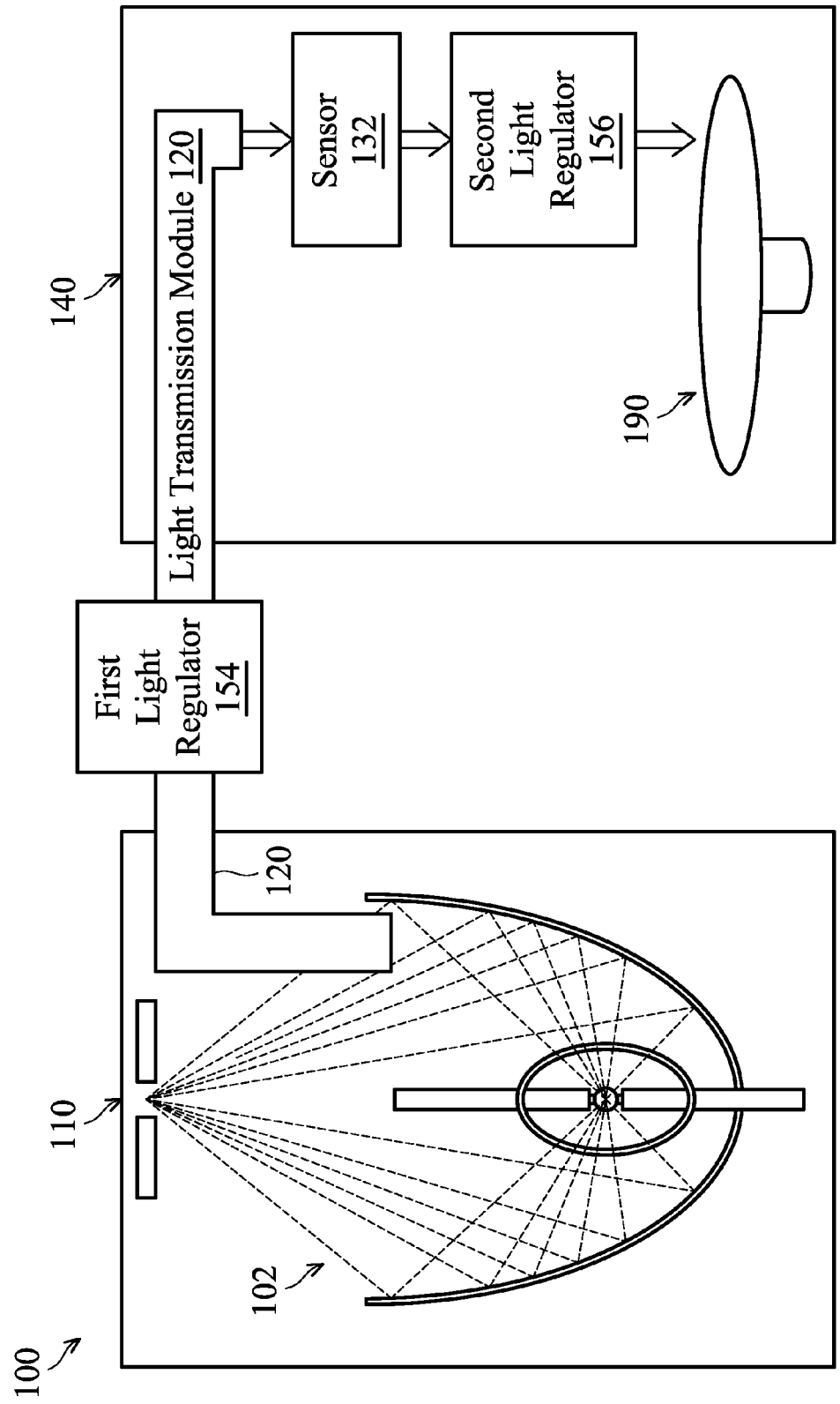
FIG. 1 illustrates a schematic diagram of a light transmission device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. The performance of a first process before a second process in the description that follows may include embodiments in which the second process is performed immediately after the first process, and may also include embodiments in which additional processes may be performed between the first and second processes. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a schematic diagram of a light transmission device 100 in accordance with some embodiments. The light transmission device 100 includes a light source 102 and parts of a light transmission module 120. For example, the light source 102 is an I-line UV (Ultraviolet) lamp, and the light transmission module 120 is an optical fiber. In some embodiments, the light source 102 is arranged in a process room 110, and the light transmission module 120 transmits a portion of the light of the light source 102 to a process room 140 for performing or implementing a first semiconductor manufacturing process over a wafer 190. For example, the process room 110 is referred as the first process room, and the process room 140 is referred as the second process room. It should be noted that the light source is a stable light source to continuously transmit or radiate lights. Therefore, the light transmission module 120 can continuously transmits a portion of the light of the light source 102.

It should be noted that the process room 140 is adjacent to the process room 110. In other words, the process room 140 is different from the process room 110. In addition, the light source 102 is arranged to perform or implement a second semiconductor manufacturing process over the wafer 190 in the process room 110. The second semiconductor manufacturing process is implemented after the first semiconductor manufacturing process, which means that the second semiconductor manufacturing process is different from the first semiconductor manufacturing process. For example, the first semiconductor manufacturing process is implemented without photo masks, and the second semiconductor manufacturing process is implemented with at least one photo mask. In another example, the first semiconductor manufacturing process is exposing the edge of the wafer, and the second semiconductor manufacturing process is exposing the wafer with a photo mask.

In some embodiments, a WEE module is arranged on the process room 140 to perform a first semiconductor manufacturing process over the wafer 190 (i.e. exposing the edge of the wafer 190). However, the WEE light has a short lifetime and a decaying light intensity, and both the WEE housing and optical parts need to be cleaned after being used for a period of time. It should be noted the light source 102 (i.e., I-line UV lamp) of the process room 110 has a longer lifetime and a better reliability than the WEE light. In addition, the light intensity of the I-line UV lamp is much larger than the light intensity of the WEE light. Therefore, in other embodiments, the WEE module of the process room 140 could be replaced by the light transmission module 120 transmitting a portion of the light of the light source 102. Compared to the WEE module, both the I-line UV lamp and the light transmission module 120 have a better reliability and suffer less decay of the light intensity. In addition, the light transmission module 120 can transmits the light directly to the wafer 190, therefore, the WEE housing and optical parts are not needed to save the coat and human resources.

As shown in FIG. 1, the light transmission device 100 further includes a sensor 132, a first light regulator 154 and a second light regulator 156. Specifically, the first light regulator 154 is arranged between the process room 110 and the process room 140, and the light regulator 154 is coupled to the light transmission module 120. In some embodiments, the first light regulator 154 works as a switch to regulate the light of the light transmission module 120 transmitted from the process room 110 to the process room 140. In other words, the first light regulator 154 is utilized to control the light transmission module 120 for adjusting the amount of the light transmitted to the process room 140. In other embodiments, a control unit (not shown) is arranged on the process room 140. The control unit is utilized to adjust or control the second light regulator 156 for regulating the light transmitted from the light transmission module 120 to the wafer 190. In addition, the control unit can be utilized to adjust or control the rotation speed of the wafer 190.

In addition, the sensor 132 is arranged in the process room 140, and detects the light transmitted from the light transmission module 120 to the wafer 190. For example, the sensor 132 inspects or detects the intensity, the spectrum and/or the quality of the light from the light transmission module 120. In other embodiments, the second light regulator 156 is arranged in the process room 140, and it adjusts or regulates the light transmitted from the light transmission module 120 to the wafer 190. It should be noted that in some embodiments, the second light regulator 156 adjusts the light according to the light intensity detected by the sensor 132. For example, an optimized value of the light intensity is pre-determined for the first semiconductor manufacturing process. If the sensor 132 detects that the light intensity from the light transmission module 120 is larger than or smaller than the optimized value, then the second light regulator 156 could adjusts the light so that the wafer 190 receives the light with the optimized intensity.

Figure 2A:
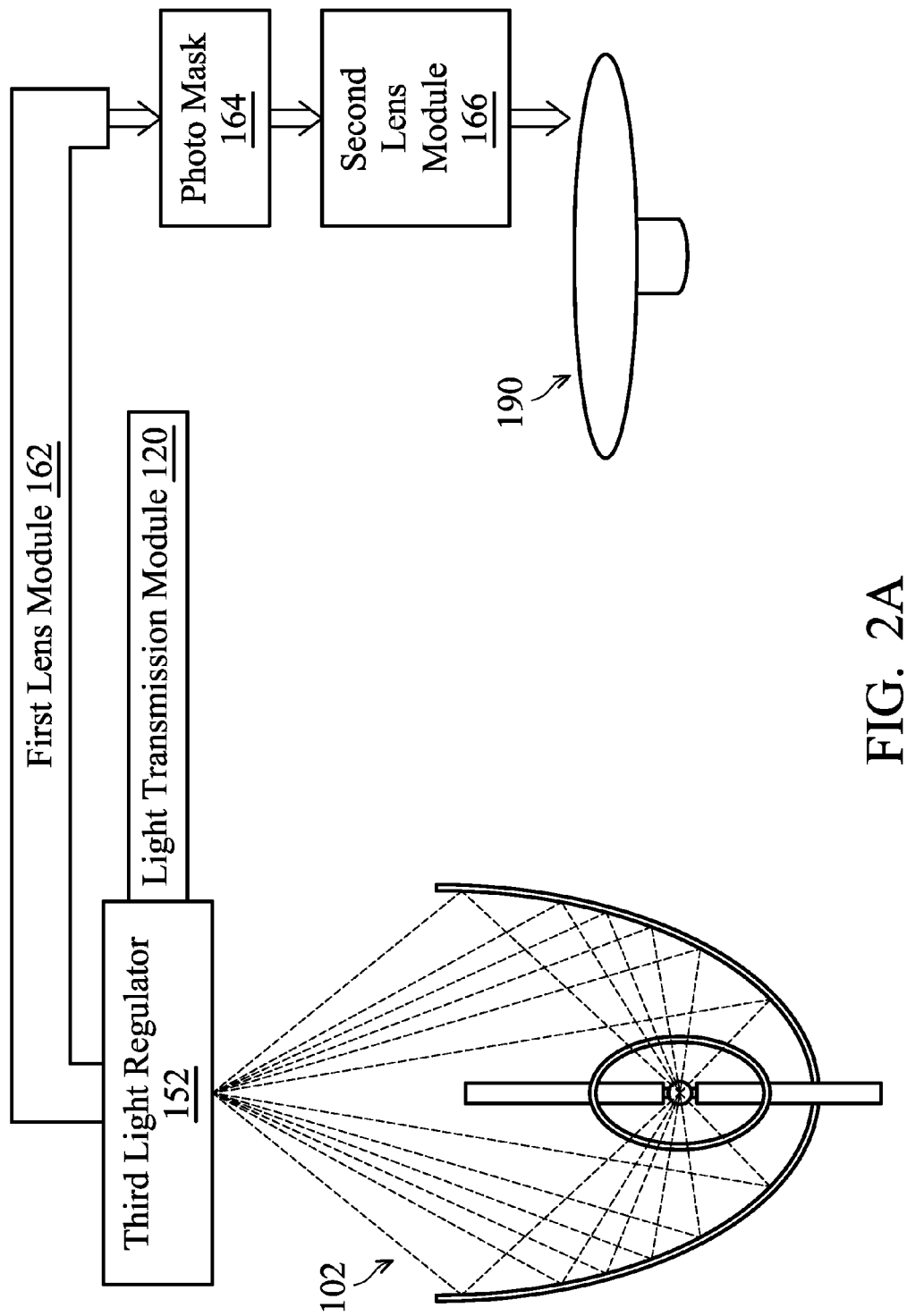
FIG. 2A illustrates a schematic diagram of a light source in accordance with some embodiments.

FIG. 2A illustrates a schematic diagram of a light source 102 in accordance with some embodiments. As shown in FIG. 2A, the light source 102, the third light regulator 152, the lens module 162 and the photo mask 164 are arranged in the process room 110. In some embodiments, the third light regulator 152 receives the light from the light source 102 and regulates the portion of the light transmitted from the light source 102 to the lens module 162. In addition, the light transmission module 120 is coupled to the third light regulator 152. For example, the third light regulator 152 divides the light of the light source 102 into two portions. Around two percent to ten percent of the light is transmitted to the light transmission module 120, and around ninety percent to ninety-eight percent of the light is transmitted to the lens module 162. In addition, the lens module 162 couples to the third light regulator 152, and adjusts the optical path and transmits the light to the photo mask 164. Finally, the light is transmitted through the photo mask 164 to expose the pattern of the photo mask 164 on the wafer 190.

Figure 2B:
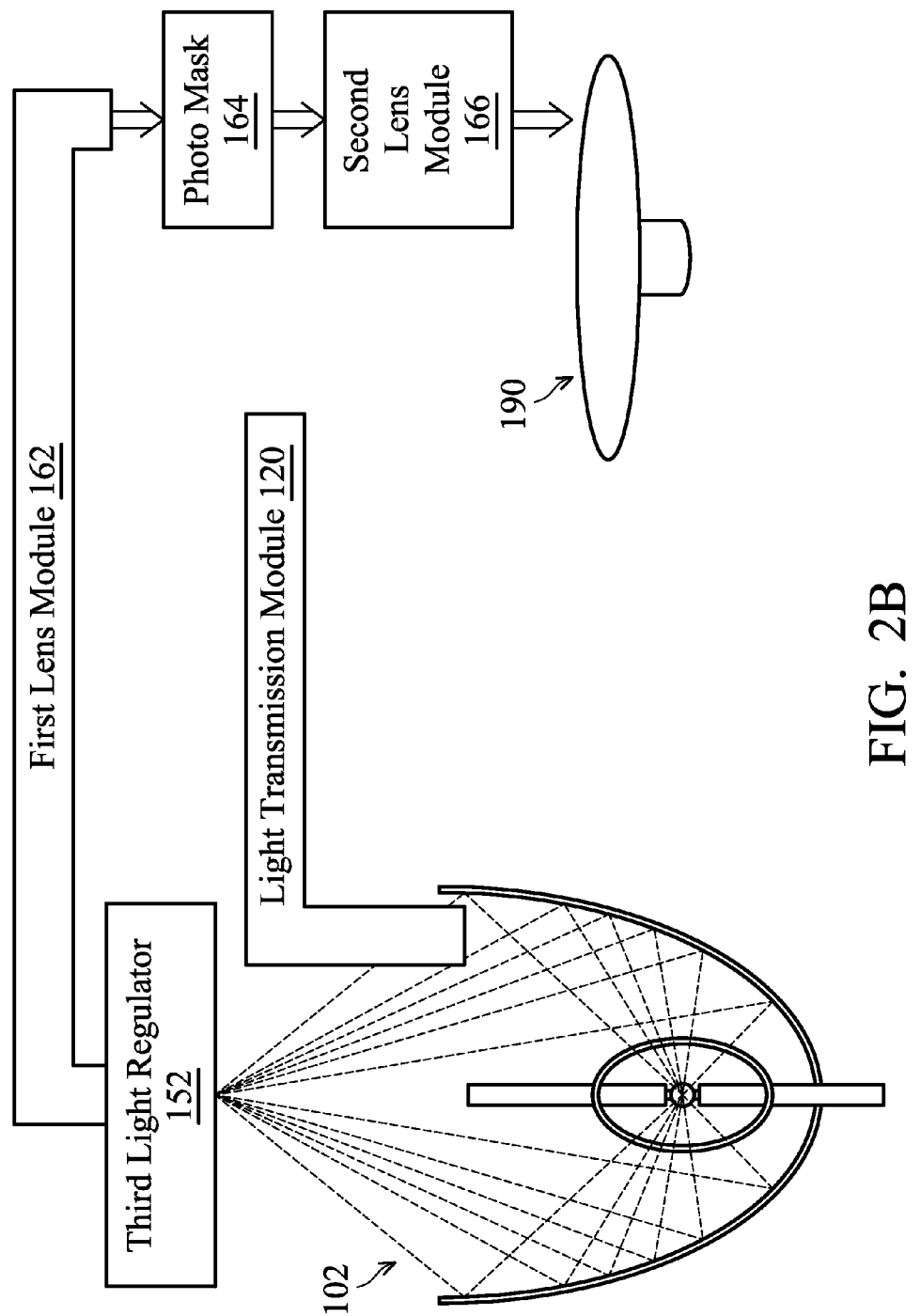
FIG. 2B illustrates another schematic diagram of a light source in accordance with some embodiments.

FIG. 2B illustrates another schematic diagram of a light source 102 in accordance with some embodiments. Most of the arrangements of FIG. 2B are the same as FIG. 2A, however, the light transmission module 120 is not coupled to the third light regulator 152. In other words, the light transmission module 120 directly receives a portion of the light from the light source 102, and the rest of the light from the light source 102 is received by the third light regulator 152. Because portion of the light the light transmission module 120 received is much less than the portion of the light the third light regulator 152 received, such arrangement has an advantage of not affecting the second semiconductor manufacturing process of the wafer 190 when the light transmission module 120 receives a small portion of light of the light source 102.

Figure 3:
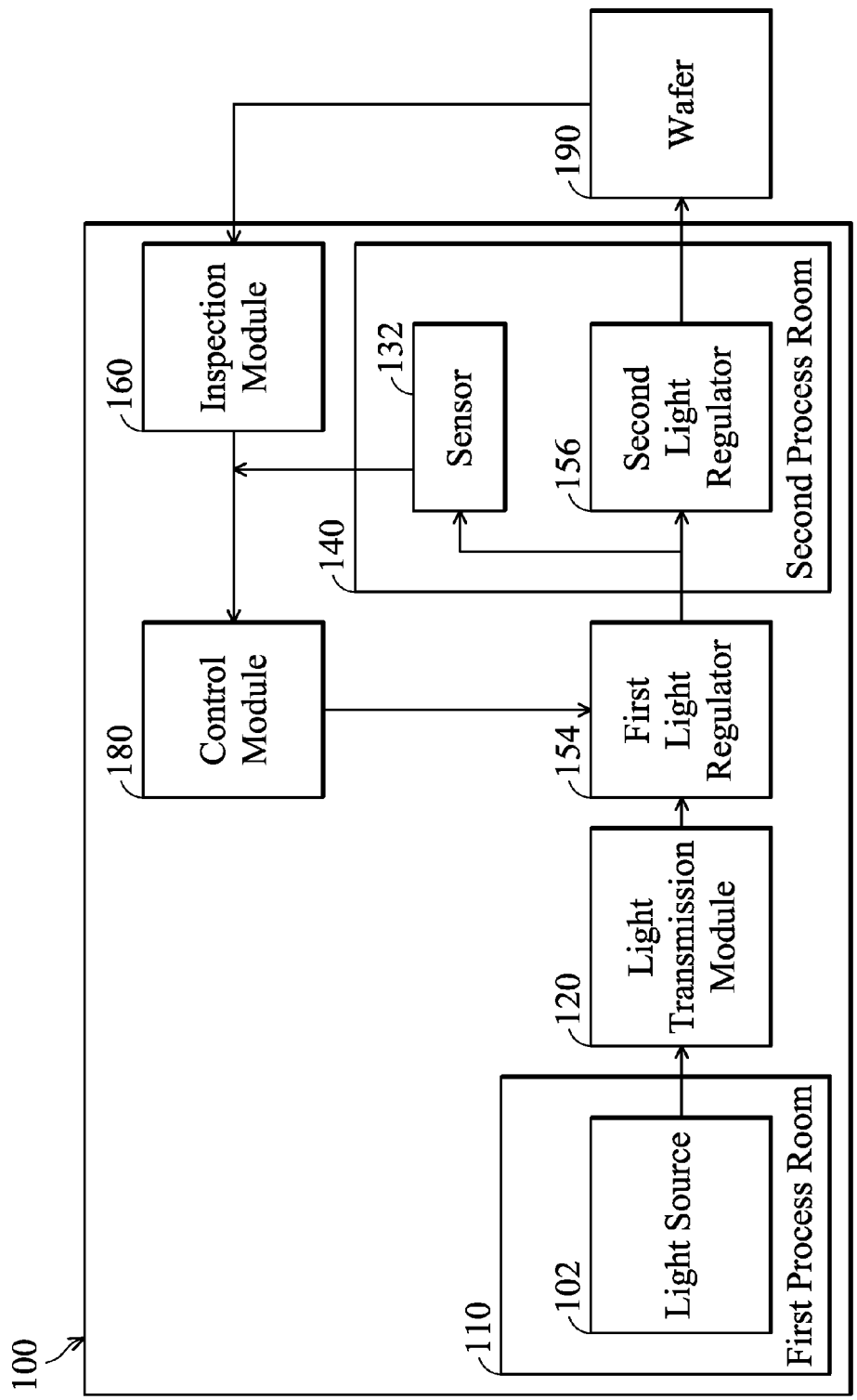
FIG. 3 illustrates a schematic diagram of a light transmission device in accordance with some embodiments.

FIG. 3 illustrates a schematic diagram of a light transmission device 100 in accordance with some embodiments. As shown in FIG. 3, the control module 180 couples to the sensor 132, the first light regulator 154, the second light regulator 156 and the inspection module 160. In some embodiments, the inspection module 160 inspects the wafer 190 to determine whether the first semiconductor manufacturing process has been implemented precisely over the wafer 190, and then transmits a signal to the control module 180 to indicate the status of the wafer 190 about the first semiconductor manufacturing process. Afterwards, the control module 180 adjusts or controls at least one light regulator (i.e., the first light regulator 154 and/or the second light regulator 156) according to the inspection module 160 and/or the sensor 132. For example, if the inspection module 160 inspects that the first semiconductor manufacturing process is not implemented precisely over the wafer 190, then control module 180 adjusts the first light regulator 154 and/or the second light regulator 156 for regulating the light of the light transmission module 120 from the light source 102 to the wafer 190.

In addition, the sensor 132 detects an amount or an intensity of the light transmitted from the light transmission module 120 to the wafer 190, and transmits a signal to the control module 180 to indicate the amount or the intensity of the light. In another example, if the sensor 132 detects that the light intensity from the light transmission module 120 does not equals to the optimized value, then control module 180 adjusts the first light regulator 154 and/or the second light regulator 156 for regulating the light of the light transmission module 120 from the light source 102 to the wafer 190. Therefore, the wafer 190 receives the light with the optimized intensity and the first semiconductor manufacturing process is implemented successfully over the wafer 190. Once the first semiconductor process is not properly implemented over the wafer 190, this problem can be detected by the inspection module 160 and/or the sensor 132 and also be adjusted by the control module 180. Therefore, with the arrangements of control module 180, inspection module 160 and/or the sensor 132, the light transmission device 100 has an advantage of automatically adjusting or calibrating the light transmitted from the light source 102 to the wafer 190.

Figure 4:
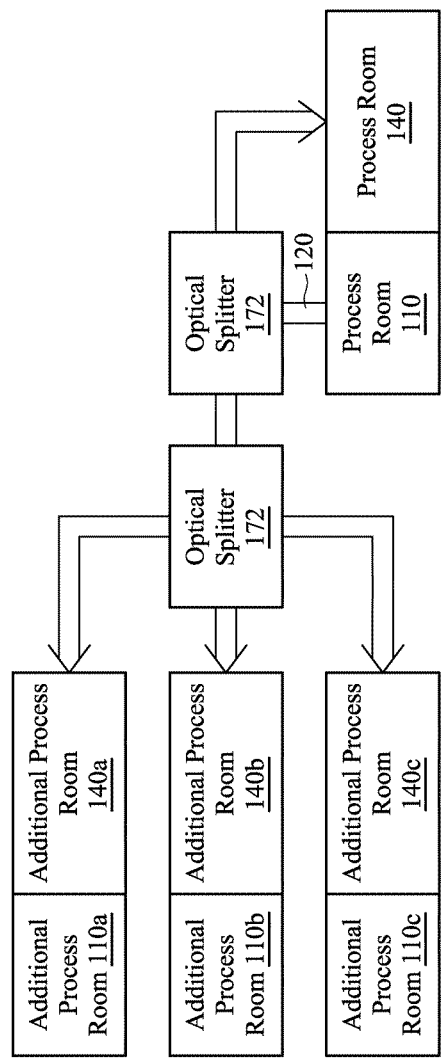
FIG. 4 illustrates a schematic diagram of an optical splitter in accordance with some embodiments.

FIG. 4 illustrates a schematic diagram of an optical splitter 172 in accordance with some embodiments. As shown in FIG. 4, at least one optical splitter 172 is coupled to the light transmission module 120. In some embodiments, the optical splitter 172 splits the light of the light transmission module 120 into the process room 140 and at least one additional process room 140a, 140b and 140c. Specifically, the light sources of the additional process room 110a, 110b and 110c are DUV (Deep Ultraviolet) lasers rather than I-line UV lamps. Because the DUV laser is a spot light source and is not able to continuously transmit or radiate light, the DUV lasers of the additional process rooms 110a, 110b and 110c cannot be the light sources for the light transmission module to transmit a portion of light to the additional process rooms 140a, 140b and 140c. Therefore, as shown in FIG. 4, the optical splitters 172 not only transmit the light from the process room 110 with the light transmission module 120 to the process room 140, but also transmit the light from the process room 110 to the additional second process rooms 140a, 140b and 140c. With the optical splitter 172, the arrangement of the light transmission device 100 could be more flexible and accessible.

Figure 5:
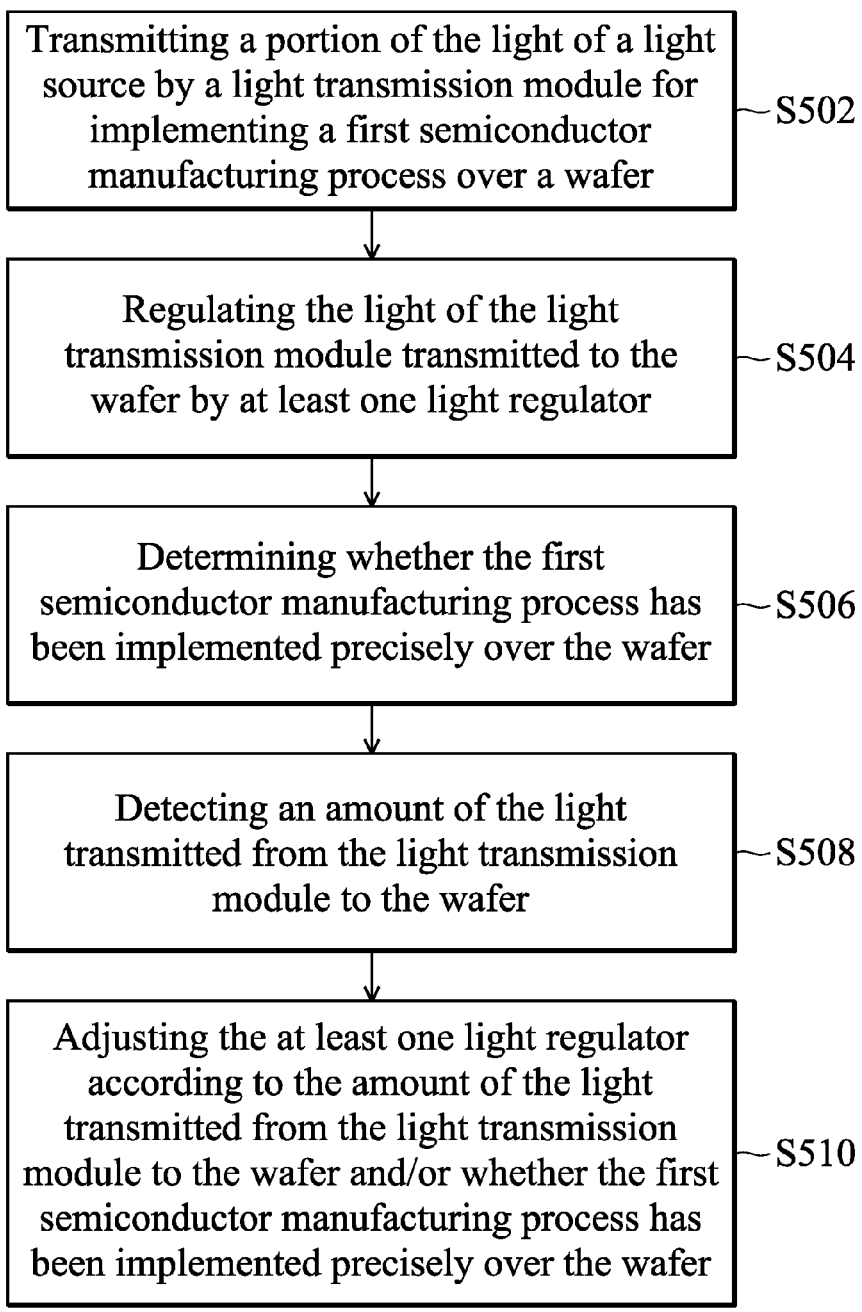
FIG. 5 illustrates a light transmission method in accordance with some embodiments.

FIG. 5 illustrates a light transmission method in accordance with some embodiments. In operation S502, a portion of the light of a light source 102 arranged in the process room 110 is transmitted by a light transmission module 120 for implementing the first semiconductor manufacturing process over a wafer 190 arranged in the process room 140. Afterwards, in operation S504, the light of the light transmission module 120 transmitted to the wafer 190 is regulated by the first light regulator 154, the second light regulator 156, and/or the third light regulator 152. Afterwards, in operation S506, whether the first semiconductor manufacturing process has been implemented precisely over the wafer 190 is determined by the inspection module 160. Afterwards, in operation S508, the amount of the light transmitted from the light transmission module 120 to the wafer 190 is detected by the sensor 132. Finally, in operation S510, the first light regulator 154, the second light regulator 156, and/or the third light regulator 152 are adjusted by the control module according to the amount of the light transmitted from the light transmission module 120 to the wafer 190 and/or whether the first semiconductor manufacturing process has been implemented precisely over the wafer 190.

In accordance with some embodiments, a light transmission device and a light transmission method are provided. The light transmission module 120 is used to transmit a portion of the light of the light source 102 to the wafer 190 through different process rooms. Compared to the WEE module, both the I-line UV lamp and the light transmission module 120 have a better reliability and suffer less decay of the light intensity. In addition, the light transmission module 120 can transmits the light directly to the wafer 190, therefore, the WEE housing and optical parts are not needed to save the coat and human resources. Therefore, a more reliable and efficient way to expose the edge of the wafer is provided in the present disclosure.

In accordance with some embodiments, a light transmission device is provided. The light transmission device includes a light source and a light transmission module. The light source is arranged in a first process room. The light transmission module transmits a portion of the light of the light source to a second process room for implementing a first semiconductor manufacturing process over a wafer. The second process room is different from the first process room.

In accordance with some embodiments, a light transmission device is provided. The light transmission device includes a light source, a light transmission module and at least one light regulator. The light transmission module transmits a portion of the light of the light source for implementing a first semiconductor manufacturing process over the wafer. The light source is utilized to implement a second semiconductor manufacturing process over a wafer. The first semiconductor manufacturing process is different from the second semiconductor manufacturing process. The at least one light regulator regulates the light of the light transmission module transmitted to the wafer.

In accordance with some embodiments, a light transmission method is provided. The light transmission method includes transmitting a portion of the light of a light source by a light transmission module for implementing a first semiconductor manufacturing process over a wafer and regulating the light of the light transmission module transmitted to the wafer by at least one light regulator. The light source is utilized to implement a second semiconductor manufacturing process over the wafer, and the first semiconductor manufacturing process is different from the second semiconductor manufacturing process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A light transmission system, comprising:
a light source, arranged in a first process room;
a light transmission module, configured to directly receive a portion of light from the light source and transmit the portion of the light from the light source to a second process room for implementing a first semiconductor manufacturing process over a wafer, wherein the second process room is different from the first process room, and the light source is configured to implement a second semiconductor manufacturing process over the wafer after the first semiconductor manufacturing process, and the first semiconductor manufacturing process is different from the second semiconductor manufacturing process;
a first light regulator, configured to receive remaining amount of the light from the light source, wherein the portion of the light received by the light transmission module does not pass through the first light regulator;
a control module, adjusting the first light regulator to regulate the light from the light source based on detection of an inspection module or a sensor;
a first optical splitter, coupled to the light transmission module, the first process room and the second process room; and
a second optical splitter, coupled between the first optical splitter and at least one additional process room which is different from the first process room and the second process room, wherein the first optical splitter and the second optical splitter are utilized to split the light from the light transmission module into the second process room and the additional process room.

2. The light transmission system as claimed in claim 1, wherein the first semiconductor manufacturing process is implemented without photo masks, and the second semiconductor manufacturing process is implemented with at least one photo mask.

3. The light transmission system as claimed in claim 2, wherein the first semiconductor manufacturing process comprises exposing an edge of the wafer, and the second semiconductor manufacturing process comprises exposing the wafer with the at least one photo mask.

4. The light transmission system as claimed in claim 1, further comprising a second light regulator coupled between the first process room and the second process room, wherein the second light regulator is configured to regulate the light from the light transmission module transmitted from the first process room to the second process room.

5. The light transmission system as claimed in claim 4, further comprising a third light regulator arranged on the second process room, wherein the third light regulator is configured to regulate the light transmitted from the light transmission module to the wafer.

6. The light transmission system as claimed in claim 1, wherein the light transmission module is not coupled to the first light regulator.

7. The light transmission system as claimed in claim 1, wherein the portion of the light received by the light transmission module is less than the remaining amount of the light received by the first light regulator.

8. The light transmission system as claimed in claim 7, wherein the portion of the light received by the light transmission module is 2 percent to 10 percent, the remaining amount of the light received by the first light regulator is 90 percent to 98 percent.

9. A light transmission system, comprising:
a light source;
a light transmission module, configured to directly receive a portion of light from the light source and transmit the portion of the light from the light source for implementing a first semiconductor manufacturing process over a wafer, wherein the light source is configured to implement a second semiconductor manufacturing process over the wafer, and the first semiconductor manufacturing process is different from the second semiconductor manufacturing process, and the first semiconductor manufacturing process and the second semiconductor manufacturing process are implemented in different process rooms;
a light regulator, configured to receive remaining amount of the light from the light source, and the portion of the light received by the light transmission module does not pass through the light regulator;
a control module, adjusting the light regulator to regulate the light from the light source based on detection of an inspection module or a sensor; and
a first optical splitter, coupled to the light transmission module, the first process room and the second process room; and
a second optical splitter, coupled between the first optical splitter and at least one additional process room which is different from the first process room and the second process room, wherein the first optical splitter and the second optical splitter are utilized to split the light from the light transmission module into the second process room and the additional process room.

10. The light transmission system as claimed in claim 9, wherein the first semiconductor manufacturing process comprises exposing an edge of the wafer, and the second semiconductor manufacturing process comprises exposing the wafer with at least one photo mask.

11. The light transmission system as claimed in claim 9, wherein the light transmission module is an optical fiber.

12. The light transmission system as claimed in claim 11, wherein the inspection module is utilized to determine whether the first semiconductor manufacturing process has been implemented precisely over the wafer.

13. The light transmission system as claimed in claim 12, wherein the sensor is utilized to detect an amount of the light transmitted from the light transmission module to the wafer.

14. The light transmission system as claimed in claim 9, wherein the control module regulates light intensity of the light from the light source to the wafer.

15. A light transmission method, comprising:
directly receiving a portion of light from a light source arranged in a first process room by a light transmission module;
transmitting the portion of the light from the light source for implementing a first semiconductor manufacturing process over a wafer arranged in a second process room; and
receiving remaining amount of the light from the light source by a light regulator for implementing a second semiconductor manufacturing process over the wafer in the first process room, wherein the portion of the light received by the light transmission module does not pass through the light regulator, the first semiconductor manufacturing process is different from the second semiconductor manufacturing process, and the second process room is different from the first process room; and
adjusting the light regulator to regulate the light from the light source based on detection of an inspection module or a sensor;
splitting the light from the light transmission module into the second process room and at least one additional process room by a first optical splitter and a second optical splitter, wherein the first optical splitter is coupled to the first process room and the second process room, and the second optical splitter is coupled between the first optical splitter and the additional process room which is different from the first process room and the second process room.

16. The light transmission method as claimed in claim 15, wherein the first semiconductor manufacturing process comprises exposing an edge of the wafer, and the second semiconductor manufacturing process comprises exposing the wafer with a photo mask.

17. The light transmission method as claimed in claim 15, further comprising regulating the portion of the light of the light source received by the light transmission module.

18. The light transmission method as claimed in claim 15, further comprising determining whether the first semiconductor manufacturing process has been implemented precisely over the wafer.

19. The light transmission method as claimed in claim 18, further comprising detecting an amount of the light transmitted from the light transmission module to the wafer.

20. The light transmission method as claimed in claim 19, further comprising adjusting the light regulator according to the amount of the light transmitted from the light transmission module to the wafer and/or whether the first semiconductor manufacturing process has been implemented precisely over the wafer.

* * * * *